(12) United States Patent
Chan et al.

(10) Patent No.: US 8,003,448 B2
(45) Date of Patent: Aug. 23, 2011

(54) SEMICONDUCTOR PACKAGE AND METHOD FOR PRODUCING THE SAME

(75) Inventors: Kai Chong Chan, Singapore (SG); Charles Wee Ming Lee, Singapore (SG); Gerald Ofner, Singapore (SG)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 12/868,147

(22) Filed: Aug. 25, 2010

(65) Prior Publication Data

US 2010/0314721 A1 Dec. 16, 2010

Related U.S. Application Data

(60) Division of application No. 11/738,641, filed on Apr. 23, 2007, now Pat. No. 7,816,235, and a continuation of application No. PCT/IB2004/003445, filed on Oct. 21, 2004.

(51) Int. Cl.
*H01L 29/06* (2006.01)
*H01L 23/34* (2006.01)
*H01L 21/00* (2006.01)

(52) U.S. Cl. ........ 438/127; 438/108; 257/618; 257/712; 257/E21.499; 257/E23.01

(58) Field of Classification Search .................. None
See application file for complete search history.

(56) References Cited

U.S. PATENT DOCUMENTS

| | | | |
|---|---|---|---|
| 6,049,124 A * | 4/2000 | Raiser et al. | 257/712 |
| 6,791,197 B1 | 9/2004 | Katz | |
| 6,908,784 B1 | 6/2005 | Farnworth et al. | |
| 2002/0013061 A1 | 1/2002 | Siniaguine et al. | |
| 2002/0089054 A1 | 7/2002 | Fukasawa et al. | |
| 2003/0062613 A1 | 4/2003 | Masumoto et al. | |
| 2004/0130004 A1 | 7/2004 | Kurosawa | |
| 2006/0055055 A1 | 3/2006 | Gross | |
| 2006/0088954 A1 | 4/2006 | Bauer et al. | |

FOREIGN PATENT DOCUMENTS

| | | |
|---|---|---|
| EP | 1484790 A1 | 12/2004 |
| WO | 03056613 A1 | 7/2003 |

OTHER PUBLICATIONS

Wolf et al, Silicon Processing for the VLSI Era vol. 1—Process Technology, 2000, Lattice Press, pp. 858, 860, and 861.*

* cited by examiner

*Primary Examiner* — Andy Huynh
*Assistant Examiner* — Valerie Brown
(74) *Attorney, Agent, or Firm* — Edell, Shapiro & Finnan, LLC

(57) ABSTRACT

A semiconductor package includes a rewiring substrate and a semiconductor chip. The semiconductor chip includes: a first face with an active surface including integrated circuit devices and chip contact pads, a second face lying in a plane essentially parallel to the first face and side faces. Each side face of the semiconductor chip lies in a plane essentially perpendicular to the first and second faces. At least one edge between two mutually essentially perpendicular faces of the semiconductor chip includes a surface.

10 Claims, 3 Drawing Sheets

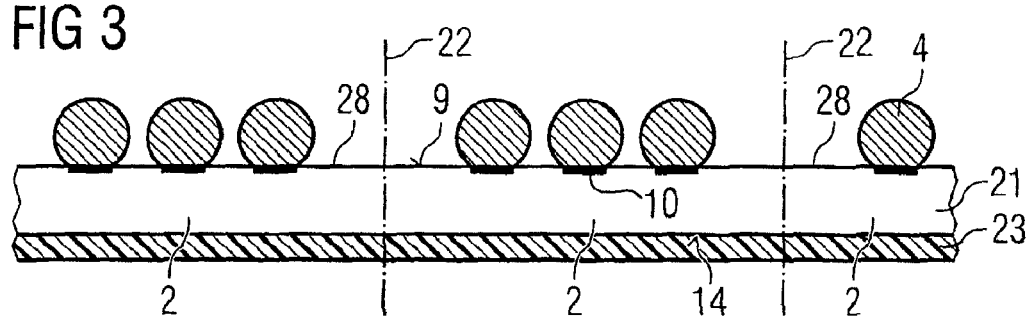
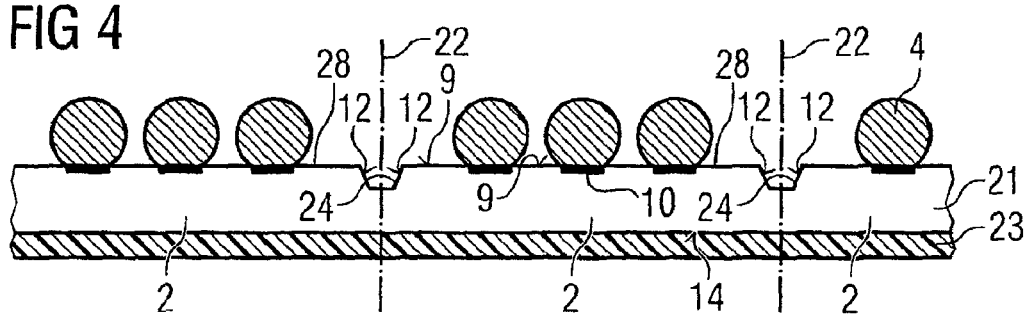
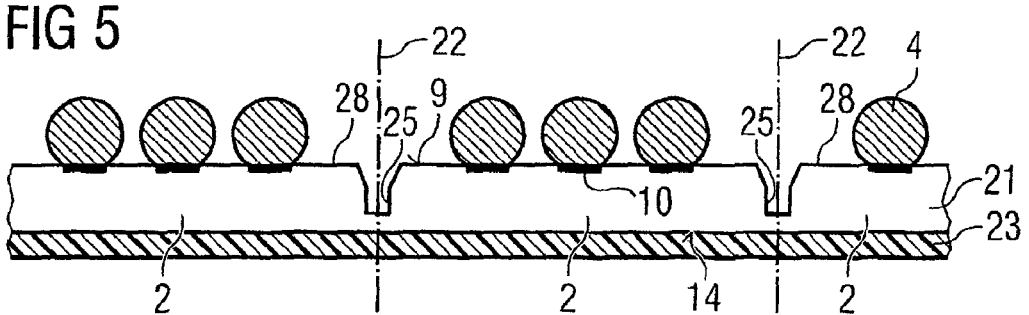

SEMICONDUCTOR PACKAGE AND METHOD FOR PRODUCING THE SAME

CROSS REFERENCE TO RELATED APPLICATIONS

This application is a divisional of U.S. patent application Ser. No. 11/738,641 filed Apr. 23, 2007, entitled "Semiconductor Package and Method for Producing the Same," which is a continuation of International Application No. PCT/IB2004/003445, filed on Oct. 21, 2004, entitled "Semiconductor Package and Method to Produce the Same," the entire contents of which are hereby incorporated by reference.

BACKGROUND

Known semiconductor or IC packages such as leadframe packages and BGA packages, for example, typically include a housing to protect the semiconductor chip and the electrical connections between the semiconductor chip and its rewiring board from mechanical and environmental damage. The semiconductor chip is typically embedded or encapsulated by a plastic or polymer-based material which forms the housing of the package.

The reliability of semiconductor packages can be improved by improving the moisture performance of the package. This is normally performed by the selection of compatible package materials in order to increase the resistance of the package to the damage caused by moisture. The process of identifying and testing package materials to achieve the desired compatibility is time-consuming and, therefore, expensive.

SUMMARY

Described herein are a semiconductor package and a method of producing the same. The semiconductor package includes a rewiring substrate and a semiconductor chip. The semiconductor chip includes: a first face with an active surface including integrated circuit devices and chip contact pads, a second face lying in a plane essentially parallel to the first face and side faces. Each side face of the semiconductor chip lies in a plane essentially perpendicular to the first and second faces. At least one edge between two mutually essentially perpendicular faces of the semiconductor chip includes a surface.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Embodiments of the semiconductor package and method will now be described with reference to the drawings, where:

FIGS. 3 to 8 illustrate steps of a method to produce a semiconductor package, where:

FIG. 3 shows a wafer including a plurality of semiconductor chip positions;

FIG. 4 shows the first bevel cut in the active surface of the wafer of FIG. 3;

FIG. 5 illustrates the step of extending the bevel cut of FIG. 4 via making a straight cut;

FIG. 6 shows the grinding of the rear surface of the wafer of FIG. 5;

FIG. 7 shows the singulation of the chips from the wafer of FIG. 6; and

FIG. 8 illustrates the plasma etching of the rear surface of one semiconductor chip of FIG. 7.

DETAILED DESCRIPTION

Figure 1:
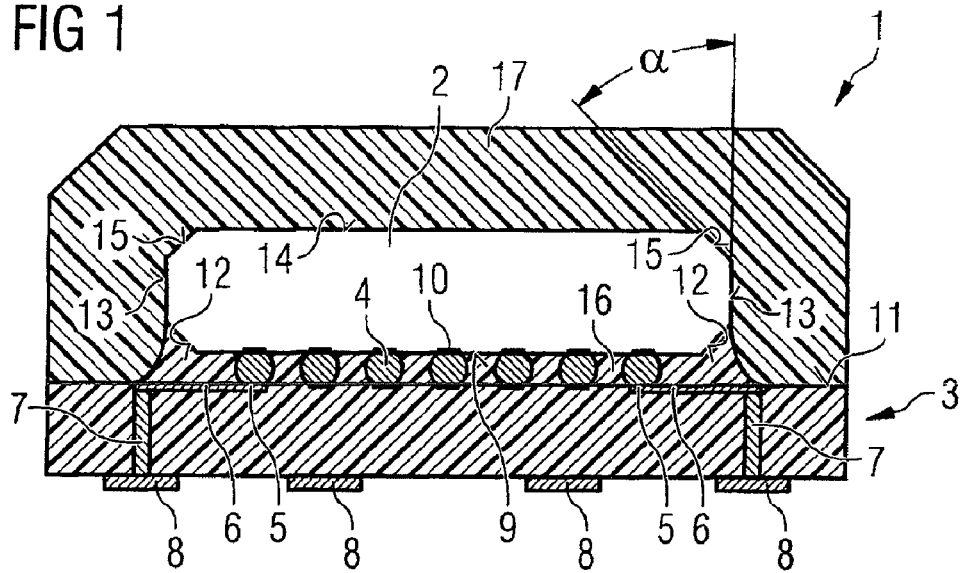
FIG. 1 illustrates an over-molded semiconductor package according to one embodiment.

The described semiconductor chip comprises: a first face with an active surface including integrated circuit devices and chip contact pads, a second face lying in a plane essentially parallel to the first face and side faces lying in a plane essentially perpendicular to the first and second faces. The semiconductor chip further comprises an edge between two mutually essentially perpendicular faces of the semiconductor chip which includes a surface.

Since in practice there may be slight variations in the thickness of the chip, the first and second faces may not lie in exactly parallel planes. In practice, these planes will, therefore, be essentially parallel. Similarly, there may be variations in the alignment of the saw when singulating the chips from the wafer. In this case, therefore, deviations may exist from a perpendicular angle between the active and side faces and passive and side faces of the chip as well as between two side faces of the chip. The terms essentially and approximately are, therefore, used.

The described semiconductor chip includes an edge formed between two essentially mutually perpendicular faces; the edge includes a surface. A sharp edge, as is formed between two essentially mutually perpendicular faces of known chips, is avoided in the described semiconductor chip. This is advantageous in that the stress which occurs between the semiconductor chip and plastic encapsulation material at the edge is reduced. It is believed that this reduces the stress levels in the package, thereby improving the compatibility of the package materials. The moisture performance of the package is improved and a more reliable semiconductor package provided.

The semiconductor chip may include chip contact pads with a flip-chip arrangement and flip-chip contacts, such as solder balls, attached to and electrically connected with each contact pad. The semiconductor chip is then connected by a flip-chip technique to a rewiring substrate. This has the advantage that the electrical connections between all of the chip contacts and the rewiring substrate are carried out essentially at the same time in one process step. Manufacturing time and costs are, therefore, reduced.

Advantageously, at least one edge between the first face and a side face of the semiconductor chip has a surface. This is believed to reduce the stress which occurs at this edge between the active surface of the semiconductor chip and the plastic encapsulation material.

Advantageously, at least one edge between the second face and a side face of the semiconductor chip has a surface. This is also believed to reduce the stress which occurs at this edge between the second face of the semiconductor chip and the plastic encapsulation material. The second face of the semiconductor chip may be the passive rear surface of the chip.

The surface of the edge formed between the two essentially mutually perpendicular faces may lie at an angle to the side face. The edge, in this embodiment, comprises a chamfer which is believed to reduce the stress at the edge between the edge and the plastic encapsulation material.

The surface of the edge may lie at an angle of between approximately 30° and approximately 60° to the side face. This is believed to further reduce the stress concentration at the edge.

Alternatively, the surface of the edge includes a rounded profile. The radius of the rounded profile of the edge may have a length of between approximately 1% and approximately 50% of the thickness of the semiconductor chip which is believed to reduce the stress concentration at the edge.

The edges between the first face and the side faces may have a chamfer and the second face and the side faces may have a rounded profile. This enables the semiconductor chip to be separated from the wafer by using a sawing technique to partially singulate the active surface of the chip and a plasma etching technique to produce the rounded edges between the passive rear face and the side faces. This is advantageous as damage to the integrated circuit structures is avoided by the use of a sawing process to partially singulate the active side of the chips from the wafer. A plasma etching technique advantageously produces rounded edges between all four edges, formed between the rear surface and the four sides' faces, essentially at the same time and in the same process step. This simplifies the manufacturing process.

Alternatively, the edges between the first face and the side faces may have a rounded profile and the second face and the side faces may have a chamfer. This has the advantage that the singulation process is carried out using only sawing processes. This simplifies the singulation process and avoids possible damage to the active surface. A rounded edge between the active surface and the side edges is advantageous if the chip is mounted with its active surface facing the rewiring board as the space between the active surface and rewiring board is reliably filled by the underfill or encapsulation material.

A semiconductor package includes a rewiring substrate having an upper surface including inner contact pads. The rewiring substrate also may include a redistribution structure of conductor tracks and vias which electrically connect the inner contact pads with outer contact pads, positioned on the opposing surface of the body of the rewiring substrate.

The semiconductor package may also include a semiconductor chip as described above mounted on the rewiring substrate. The semiconductor chip includes at least one edge between two mutually essentially perpendicular faces of the semiconductor chip with a surface. Plastic mold material encapsulates at least the side faces of the semiconductor chip and covers the upper surface of the rewiring substrate.

The plastic encapsulation material provides protection for the semiconductor chip and the electrical connections. The edge of the semiconductor chip including a surface is believed to decrease the stress concentration at this edge between the chip and the plastic material. This improves the moisture performance of the package and increases the reliability of the semiconductor package.

The semiconductor chip including at least one edge with a surface may be positioned on the rewiring substrate with its active surface positioned towards the upper surface of the rewiring substrate. The semiconductor chip may be mechanically and electrically connected to the rewiring substrate by flip-chip contacts, such as solder balls, positioned between the chip contact pads and the inner contact pads. The second passive rear face and the side faces of the semiconductor chip are embedded in the mold material. The flip-chip contacts and active surface may be embedded in underfill material.

This semiconductor package has the advantage that the stress between the semiconductor chip and the plastic encapsulation material is reduced.

A method to produce a semiconductor chip as described above comprises the following steps. A semiconductor wafer including a plurality of semiconductor chip positions arranged in rows and columns in a grid pattern is provided. Each semiconductor chip position includes a semiconductor chip. The semiconductor chip positions have a front face with integrated circuits and chip contact pads which comprises the active front side of the wafer and a rear face which comprises the passive rear side of the wafer. The semiconductor chip positions are separated from adjacent positions in the wafer by singulation alleys in which no integrated circuits are located.

A first adhesive tape is attached to the rear face of the wafer and a first bevel cut made in the front face of the wafer in approximately the lateral center of the singulation alley in approximate lateral alignment with the desired sawing line. In practice, there is some deviation in the positioning of the cut from the ideal or desired position so that the cut is made in approximate alignment with the lateral center of the singulation alley.

Preferably, a bevel cut is made in each singulation alley in the front side of the wafer in this stage of the process. The first bevel cut may be a partial cut which forms a channel or groove in the singulation alley approximately equidistant from the two adjacent chip positions. The side walls of the channel may comprise the surface of the edge between the first active side and side faces of two adjacent chip positions.

The individual semiconductor chips are then separated from the wafer and at least one edge with a surface formed in the semiconductor chip.

The semiconductor chips are, in one embodiment, separated from the wafer by the following process steps. After the first bevel cuts are made in the singulation alleys of the front surface of the wafer, a straight sided cut is made from the front side of the wafer in a position approximately laterally aligned with the lateral center of the first bevel cut. Since in practice there is a degree of misalignment in the positioning of the saw blade in relation to the lateral centers of the first bevel cut, the straight sided but is made is approximately the lateral center of the first bevel cut.

A straight sided cut is used here to mean a cut in which the two sides are approximately straight and the surfaces formed lie approximately parallel to one another. In practice, there will be some deviation in the thickness of the saw blade and direction of cutting so that the sides of the cut, and faces formed, will deviate from the ideal. A straight sided cut is used here to describe a cut which does not produce an edge with a surface as is produced by the bevel cut.

A straight sided cut may be made from the front side of the wafer in approximately the lateral center of each singulation alley in this stage of the process. The straight sided cut may extend into the wafer up to at least approximately half the thickness of the wafer. The semiconductor chips are then partially separated from each other but still joined together by material at the rear surface. A second adhesive tape is then attached to the front face of the wafer. The wafer is inverted and the first adhesive tape removed.

The rear surface of the wafer is then ground by mechanical grinding or polishing or chemical-mechanical polishing. The thickness of the wafer is reduced by the grinding process until the partial cuts located in the singulation alleys in the front side of the wafer are exposed and the semiconductor chips separated from the wafer.

The rear face of the semiconductor chip is then subject to a plasma etching treatment to form edges with a rounded profile between the passive rear surface and side edges of the semiconductor chip.

This method has the advantages that the thickness of the wafer is reduced during the singulation process and that this is performed by a simple grinding method. The use of a plasma etching process to produce the rounded edges between the passive rear side of the chip and the side faces is advantageous as all the rounded edges are produced essentially at the same time in a single process step. Additionally, the plasma etching process can be carried out for many chips in the same process step further reducing manufacturing time and costs.

Another method for separating the semiconductor chips from the wafer involves the following process steps. A straight sided cut is made from the active front side of the wafer which is approximately aligned with the lateral center of the first bevel cut. In this embodiment of the method, the straight cut is made through the entire thickness of the wafer. Therefore, after such a straight sided cut is made in each of the singulation alleys, a plurality of separated semiconductor chips attached to the first adhesive tape.

The wafer is then inverted and the first adhesive tape removed. The rear side of the semiconductor chip is then subjected to a plasma etching process which decreases the thickness of the chip and forms rounded edges between the passive rear surface and side edges of the semiconductor chip.

This method has the advantage that the singulation of the chips is performed by two sawing process steps which are simple and easy to carry out. In addition, the use of plasma etching enables rounded edges to be formed between the rear surface and all the side edges in one process step. Manufacturing costs are, therefore, reduced.

Another method for separating the semiconductor chips from the wafer includes the following process steps. After the process step of making the first bevel cuts, a second adhesive tape is attached to the active surface of the wafer, the wafer inverted and the first adhesive tape removed. A second bevel cut is made in the passive rear surface of the wafer. The second bevel cut is made in approximate lateral alignment with the lateral center of the singulation alley. Such a second bevel cut may be made in each singulation alley in the same process step. The second bevel cut also produces a channel or groove with a cross-section which produces the desired surface to the edge.

A straight cut is then made from the rear side of the wafer in approximate lateral alignment with the lateral center of the second bevel cut. Such a straight cut may be made in each second bevel cut to separate the semiconductor chips from the wafer. This embodiment of the method has the advantage that sawing processes are used to singulate the chip from the wafer and to produce edges with a surface between both the active surface of the chip and the side faces and the rear surface of the chip and the side faces. Sawing processes are quick and simple and also widely used so that the cost of manufacturing the chips can be reduced. Also, the possibility of damage to the integrated circuit devices of the active surface during a plasma etch process is avoided.

The first bevel cut may be made by profile sawing using a saw with a profile blade, and the straight cut is made using a straight saw blade.

The profile saw blade may produce a bevel cut or channel or groove with a symmetrical cross-section. The bevel cut may produce two surfaces which are inclined with respect to the cutting direction. This produces an edge with a surface or a chamfer at the edge between the active surface and side faces of two adjacent semiconductor chips in the wafer. The number of cuts required to separate the chips including edges with a surface from the wafer is, therefore, reduced.

Similarly, a surface which is inclined to the side faces or a chamfer is formed by the second bevel cut at the edge between the rear surface and side faces of two adjacent semiconductor chips in the wafer.

Alternatively, a rounded edge is formed by the first bevel cut. The profile saw blade may produce a bevel or groove with a symmetrical cross-section so that a rounded edge is produced at the edge between the active surface and side faces of two adjacent chips in the wafer.

Alternatively, the second bevel cut may produce a rounded edge between the passive rear surface and the sides between adjacent semiconductor chip positions in the wafer.

A method to assemble a semiconductor package comprises the following steps. A rewiring substrate including a plurality of inner contact pads on its upper surface is provided. A semiconductor chip which, according to the invention, includes at least one edge with a surface mounted on the upper surface of the rewiring substrate. The semiconductor chip is then encapsulated in a plastic mold material.

All the edges between the active surface and side walls and passive surface and side walls may include a surface. This is believed to reduce the stress within the package effectively and simplifies the singulation process.

The semiconductor chip may be mounted by flip-chip contacts, such as solder balls, to the upper surface of the rewiring substrate. The flip chip contacts may be positioned between and electrically connect the chip contact pads and inner contact pads of the rewiring substrate.

The space between the active surface of the chip and the rewiring substrate is then underfilled with underfill material and the passive rear surface and side walls of the chip encapsulated by a mold material. The encapsulation of the chip may be carried out using an over-molding method.

The described method provides a semiconductor package with improved reliability. The reliability is thought to be improved by reducing the stress level at the highest stress concentration points in the package. The highest stress in conventional packages, such as overmolded (LF)BGA packages, is believed to occur at the edges of the chip or die within the package. This stress is thought to be mainly contributed by the sharp edges of the die and is thought to be reduced by providing a semiconductor package including a chip in which the edges of the chip comprise a chamfer or radius edge.

Conventionally, semiconductor chips are separated from the wafer in a sawing process using a straight saw blade. This produces an approximately straight sided cut and an angle of approximately 90° between the active surface and side faces and passive surface and side faces of the chip. According to the described semiconductor chip, the chamfer or radius edge is simply and easily produced by the singulation method. In addition, since the edges of the chip include a chamfer or rounded edge, the problem of die chipping which can occur during the singulation or dicing process is minimized. Therefore, the described method provides a more reliable semiconductor package without increasing the complexity of the manufacturing process.

The semiconductor or IC package as described herein has the advantage that changes in the design of the package are avoided. The invention can be used in all types of known semiconductor packages without requiring changing the packaging material set for the package. The search for compatible materials for a package design is, therefore, avoided and the lead time for product to market can be reduced.

In the following paragraphs, exemplary embodiments of the semiconductor package and method are described in connection with the figures.

FIG. 1 illustrates an over-molded semiconductor package 1, according to a first embodiment, which includes a semiconductor chip 2 mounted to a re-wiring substrate 3 by a plurality of flip-chip contacts 4.

The body of the rewiring substrate 3 comprises a dielectric material, e.g., BT or FR4, and includes a plurality of inner contact pads 5 on its upper surface 11 which are electrically connected by a plurality of conductor tracks 6 positioned on the upper surface 11 to a plurality of vias 7 which extend through the thickness of the rewiring substrate 3. A via 7 electrically connects an inner contact pad 5 to one of a plurality of outer contact areas 8 positioned on the bottom surface of the rewiring substrate 3. The conductor tracks 6 and vias 7 form the redistribution structure for the semiconductor chip 2. The outer contact areas 8 have a different arrangement to the inner contact pads 5 on the upper surface of the rewiring board 3. The spacing between the outer contact areas 8 is larger than the spacing between the inner contact areas 5.

The semiconductor chip 2 includes integrated circuit devices positioned in its active surface 9. The active surface 9 further includes a plurality of microscopic chip contact pads 10 which provide for the electrical connection to the integrated circuit devices of the semiconductor chip 2. The semiconductor chip 2 is mounted on the upper surface 11 of the rewiring substrate 3 and electrically connected to the redistribution structure of the rewiring substrate 3 by microscopic solder balls 4 which form the flip chip contacts and which are positioned between the chip contact pads 10 and the inner contact pads 5 of the rewiring substrate 3. The lateral arrangement of the inner connect pads 5 of the rewiring substrate 3, therefore, corresponds to the arrangement of the chip contact pads 10 so that a microscopic solder ball 4 is positioned between each chip contact pad 10 and an inner contact pad 5.

The semiconductor chip 2 according to the first embodiment includes a first chamfered edge 12 positioned in the edge between the active front surface 9 of the semiconductor chip 2 and the four side faces 13 of the semiconductor chip 2. The four side faces 13 are orientated approximately perpendicularly to the active front surface 9 and passive rear surface 14 of the semiconductor chip 2. In this first embodiment, the semiconductor chip 2 further includes a second chamfered edge 15 positioned between the passive rear face 14 and the side faces 13 of the semiconductor chip 2. The surface of the first 12 or second chamfer 15 lies at an angle α to the side faces 13 of the semiconductor chip 2.

The angle of the surface of the second chamfer 15 to the side face 13 is, in this embodiment, approximately 60°. Similarly, the angle of the surface of the first chamfer 12 to the side face 13 is approximately 45°. According to the described device, the angle α may lie in the range from approximately 30° to approximately 60°.

As is described in more detail with reference to FIGS. 3 to 8, the first 12 and second 15 chamfers are formed by a sawing process using a profile saw during the singulation of the semiconductor chip 2 from the wafer.

The space formed between the active surface 9 of the semiconductor chip 2 and the upper surface 11 of the rewiring substrate 3 is filled by underfill material 16 which comprises a plastic. The underfill material 16 protects the delicate flip chip contacts 4, represented by the microscopic solder balls 4, from mechanical damage as well as the environment which can cause corrosion of the contacts.

The passive rear side 14 and side faces 13 of the semiconductor die 2 and the upper surface 11 of the rewiring substrate 3 are covered by a plastic mold material 17 to form the semiconductor package 1 according to the first embodiment.

Figure 2:
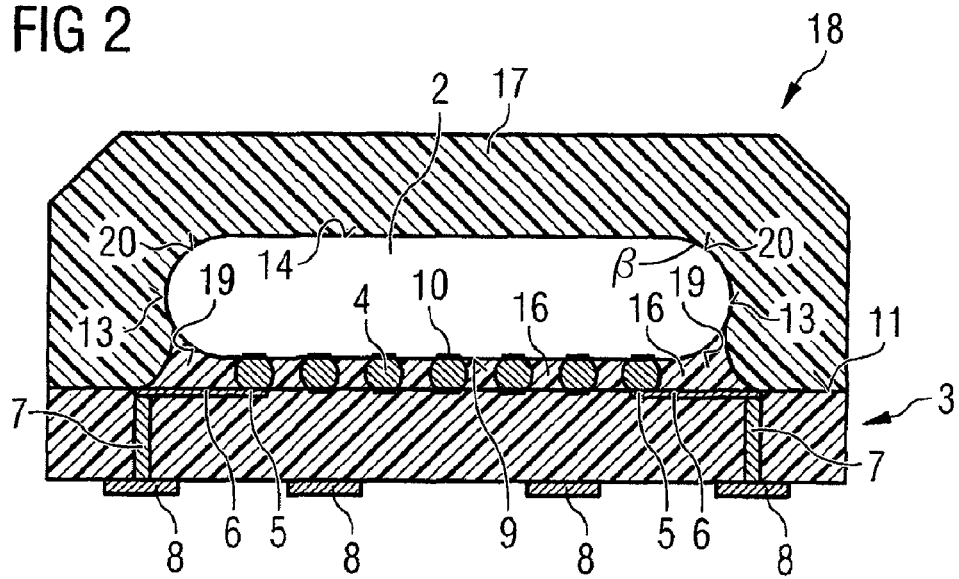
FIG. 2 depicts an over-molded semiconductor package according to a second embodiment.

FIG. 2 depicts an over-molded semiconductor package 18 according to a second embodiment. Parts of the second semiconductor package 18 which are essentially the same as that of the first semiconductor package 1 shown in FIG. 1 are indicated with the same reference number and are not necessarily described again.

The second semiconductor package 18 also includes a semiconductor chip 2 mounted to a rewiring substrate 3 by solder balls 4 which form the flip chip contacts between the chip 2 and the rewiring substrate 3. The semiconductor package 18, according to the second embodiment, is distinguished from the first semiconductor package 1 in that the semiconductor chip 2 includes a first rounded edge 19 between the active front surface 9 and four sides faces 13 of the semiconductor chip 2 and a second rounded edge 20 between the passive rear surface 14 and the four side edges 13 of the chip 2.

The rounded edges 19 and 20 are characterized by a radius β which, according to the described semiconductor package, can have a length of up to approximately 50% of the thickness of the semiconductor chip 2.

The first 19 and second 20 rounded edges are formed by a sawing process using a profile saw when the semiconductor chip 2 is singulated from the wafer.

Also described herein is a method to fabricate the semiconductor packages 1 and 18. The steps of a process to fabricate the semiconductor chip 2 are shown in FIGS. 3 to 8.

FIG. 3 shows a section of a semiconductor wafer 21 which includes a plurality of semiconductor chip positions 2 arranged in rows and columns in a grid pattern. The plurality of semiconductor chip positions 2 include an active surface 9, in which the integrated circuits are arranged, and chip contact pads 10. A microscopic solder ball 4 is attached to each of the plurality of chip contact pads 10 at the wafer level. After the singulation process, each semiconductor chip position 2 provides a semiconductor chip 2. The semiconductor chip positions 2 are separated from each other in the wafer 21 by singulation alleys 28, in which no integrated circuit devices or chip contact pads 10 are located. The sawing lines are positioned in the singulation alleys approximately equidistant from two adjacent semiconductor chip positions and are indicated in the figures by the dashed lines 22.

In the first step of the process, shown in FIG. 3, a first adhesive tape 23 is attached to the passive rear surface 14 of the wafer 21.

FIG. 4 shows the next step of the process in which a bevel cut 24 is formed in the active surface 9 of the wafer approximately aligned with the sawing line 22 positioned between the semiconductor chips 2. The bevel cut 24 produces a groove in the singulation alley 28 between two adjacent chip positions 2. The bevel cut 24 forms a chamfered edge 12 with the desired angle to the active surface 9 in each of the adjacent semiconductor chips 2 in the wafer 21. The bevel cut 24 is made by a saw cut using a blade with the desired profile. In this embodiment, the bevel cut 24 has a cross-section with a flat bottom and outwardly sloping sides.

In the next step of the process, as illustrated in FIG. 5, a second straight sided cut 25 is made along the sawing lines 22 which extend the penetration of the bottom surface of the bevel cut 24 deeper into the thickness of the wafer 21. In this embodiment, the straight cut 25 is made to at least approximately half the thickness of the wafer 21.

Figure 6:
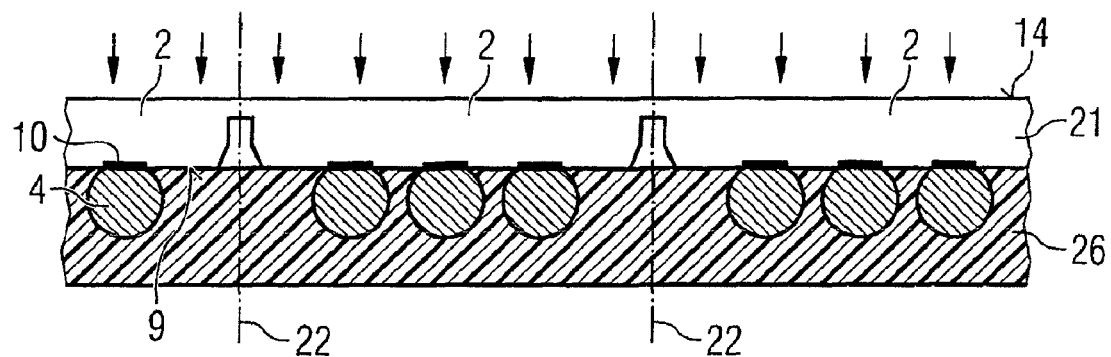

A second adhesive tape 26 is then attached to the active surface 9 of the wafer 21, the wafer 21 is turned over and the first adhesive tape 23 is removed from the passive rear surface 14 of the wafer 21. This step of the process is illustrated in FIG. 6. The passive rear surface 14 of the wafer is then subjected to a grinding treatment, which is illustrated by the arrows in FIG. 6, to reduce the thickness of the wafer 21.

Figure 7:
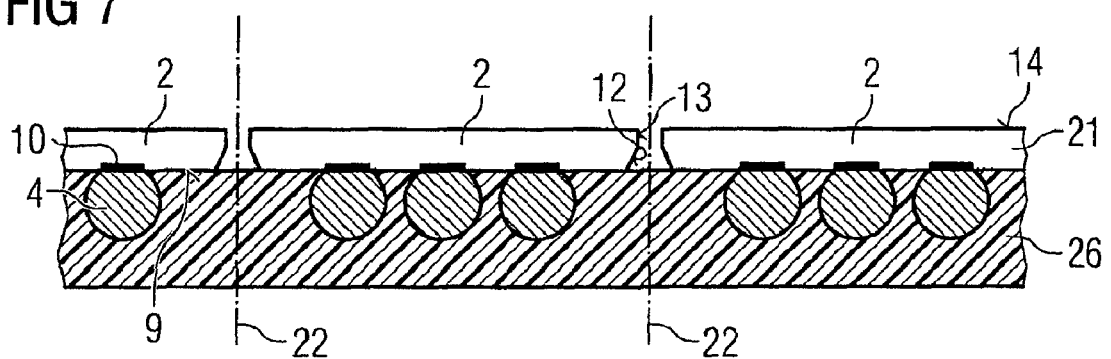

As shown in FIG. 7, the back grinding process is carried out until the thickness of the wafer 21 is reduced to such an extent that the straight cut 25 is exposed and the plurality of semiconductor chips 2 are separated from the wafer 21. At this stage of the process, the edge between the passive rear surface 14 and the side faces 13 of each chip 2 is essentially perpendicular.

Figure 8:
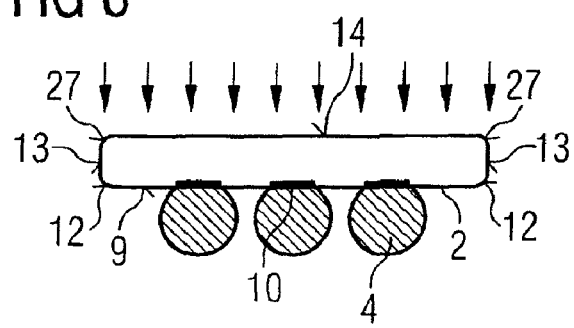

The rear side 14 of the semiconductor chips 2 is then subjected to a plasma etching treatment, as indicated by the arrows in FIG. 8. This removes material from the sharp, approximately perpendicular, edges between the passive rear surface 14 and side edges 13 to form a rounded edge 27 between the passive rear surface 14 and side faces 13 of the semiconductor chip 2.

According to another method which is not illustrated in the figures, the semiconductor chips 2 are separated from the wafer 21 by continuing the straight cut 25 through the thickness of the wafer 21. The first adhesive tape 23 is removed and the rear surface 14 of the semiconductor chip 2 is subjected to a plasma etching process to produce rounded edges 27 between the passive rear surface 14 and side faces 13.

In a further embodiment of the method which is also not illustrated in the figures, after the first bevel cut 24 into the active front side 9 of the wafer 21, the wafer 21 is turned over, as shown in FIG. 6, and the semiconductor chips 2 separated from the wafer 21 by, first, making a second bevel cut into the passive rear surface 14 of the wafer 21. The second bevel cut is made in approximate alignment with each sawing line 22.

A straight cut is then made from the rear side 14 of the wafer 21 laterally aligned with the sawing lines 22. The straight cut extends through the thickness of the wafer to separate the semiconductor chips 2. The second bevel cut forms the chamfered edges 15 between the passive rear surface 14 and the side edges 13 of the chips in the same way as that illustrated in FIG. 4 for the active front surface 9.

In further process steps not illustrated in the figures, the semiconductor packages 2 and 18 shown in FIGS. 1 and 2 are assembled including the semiconductor chips 2 produced as described above.

A semiconductor chip 2 including chamfered or rounded edges between the front surface 9 and side faces 13 and rear surface 14 and side faces 13 is mounted onto a rewiring substrate 3 by a flip chip method. The active surface 9 is positioned facing the upper surface 11 of the rewiring substrate 3 and flip chip contacts, such as microscopic solder balls 4, are positioned between the chip contact pads 10 and the inner contact pads 5 of the rewiring substrate 3.

The space between the active surface 9 of the semiconductor chip 2 and the upper surface of the rewiring substrate 3 is filled with underfill material 16. The passive rear surface 14, side faces 13 and remaining upper surface 11 of the rewiring substrate 3 are then encapsulated by a plastic material 17 in a molding process to form an overmolded semiconductor package 2, 18.

External electrical contacts, such as solder balls, are connected to the outer connect areas 8 of the rewiring substrate 3. These outer contacts enable the semiconductor package 2, 18 to be mounted on and electrically connected to an external substrate such as a printed circuit board.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A semiconductor chip, comprising:
   a first face with an active surface including integrated circuit devices and chip contact pads;
   a second face lying in a plane essentially parallel to the first face;
   a plurality of side faces, each side face lying in a plane essentially perpendicular to the first and second faces; and
   at least one edge disposed between two mutually essentially perpendicular faces of the semiconductor chip, wherein the at least one edge includes a surface, and wherein edges between the first face and the side faces include a chamfer and edges between the second face and the side faces include a rounded profile.

2. The semiconductor chip according to claim 1, wherein at least one edge disposed between the first face and a side face includes a surface.

3. The semiconductor chip according to claim 1, wherein at least one edge between the second face and a side face includes a surface.

4. The semiconductor chip according to claim 1, wherein the surface of at least one edge lies at an angle to the side face.

5. The semiconductor chip according to claim 4, wherein the angle to the side face is in the range between approximately 30° and approximately 60°, inclusive.

6. The semiconductor chip according to claim 1, wherein a radius of the rounded profile has a length in the range between approximately 1% and approximately 50%, inclusive, of the thickness of the semiconductor chip.

7. A semiconductor package, comprising:
   a rewiring substrate with an upper surface including inner contact pads;
   the semiconductor chip of claim 1, mounted to the rewiring substrate; and
   a mold material embedding at least the side faces of the semiconductor chip and covering the upper surface of the rewiring substrate.

8. The semiconductor package according to claim 7, wherein:
   the semiconductor chip is positioned on the rewiring substrate with its active surface positioned towards the upper surface of the rewiring substrate;
   the semiconductor chip is connected to the rewiring substrate by flip-chip contacts positioned between the chip contact pads and the inner contact pads of the rewiring substrate; and
   the second and side faces of the semiconductor chip are embedded in the mold material.

9. A method for assembling a semiconductor package, the method comprising:
   (a) providing a rewiring substrate with an upper surface including a plurality of inner contact pads;
   (b) mounting the semiconductor chip of claim 1 on the upper surface of the rewiring substrate; and
   (c) encapsulating the semiconductor chip in a mold material.

10. The method for assembling a semiconductor package according to claim 9, wherein the semiconductor chip is mounted via flip-chip contacts.

* * * * *